US006654446B2

(12) United States Patent
Bender, III

(10) Patent No.: US 6,654,446 B2
(45) Date of Patent: Nov. 25, 2003

(54) CAPILLARY DISCHARGE SOURCE

(75) Inventor: Howard Albert Bender, III, Manteca, CA (US)

(73) Assignee: EUV LLC, Santa Clara, CA (US)

( * ) Notice: Subject to any disclaimer, the term of this patent is extended or adjusted under 35 U.S.C. 154(b) by 164 days.

(21) Appl. No.: 09/955,658

(22) Filed: Sep. 18, 2001

(65) Prior Publication Data

US 2003/0053593 A1 Mar. 20, 2003

(51) Int. Cl.$^7$ ................................................. H01J 35/00
(52) U.S. Cl. ...................................... 378/119; 378/143
(58) Field of Search ................................ 378/119, 143; 250/504 R; 372/76, 87

(56) References Cited

U.S. PATENT DOCUMENTS

| | | | |
|---|---|---|---|
| 5,499,282 A | 3/1996 | Silfvast | |
| 5,577,092 A | 11/1996 | Kubiak et al. | |
| 5,963,616 A | 10/1999 | Silfvast et al. | |
| 6,031,241 A | 2/2000 | Silfvast et al. | |
| 6,232,613 B1 * | 5/2001 | Silfvast et al. | 250/504 R |
| 6,356,618 B1 * | 3/2002 | Fornaciari et al. | 378/119 |
| 6,498,832 B2 * | 12/2002 | Spence et al. | 378/119 |

OTHER PUBLICATIONS

Mirkarimi, P.B. et al., "Advances in the reduction and compensation of film stress in high–reflectance multilayer coatings for extreme ultraviolet lithography", SPIE vol. 3331, pp. 133–148.

Klosner, M.A. et al., "Intense plasma discharge source at 13.5 nm for extreme–ultraviolet lithography", Optic Letters, vol. 22, No. 1, 1997, pp. 34–36.

Kubiak, G.D., et al., "High–power extreme ultraviolet source based on gas jets", SPIE vol. 3331, pp. 81–89.

Klosner, M.A. et al., "Intense xenon capillary discharge extreme–ultraviolet source in the 10–16–nm–wavelength region", Optics Letters, vol. 23, No. 20, 1998, pp. 1609–1611.

Silfvast, W.T., et al., "High–power plasma discharge source at 13.5 nm and 11.4 nm for EUV lithography", Proceedings of SPIE, Yuli Vladimirsky, 3676, pp. 272–275, 1999.

Dedkov, V.S. et al., "Properties of Rhombohedral Pyrolytic Boron Nitride", Inorganic Materials, vol. 32, No. 6, 1996, pp. 609–614.

Duclaux, L., et al. "Structure and low–temperature thermal conductivity of pyrolytic boron nitride", Physical Review B, vol. 46, No. 6, 1992, pp. 3362–3367.

Moore, A.W., "Compression Annealing of Pyrolytic Boron Nitride" Nature "Letters to the Editor", vol. 221, 1969, pp. 1133–1134.

* cited by examiner

*Primary Examiner*—Louis Arana
(74) *Attorney, Agent, or Firm*—Fliesler Dubb Meyer & Lovejoy LLP

(57) ABSTRACT

Debris generation from an EUV electric discharge plasma source device can be significantly reduced or essentially eliminated by encasing the electrodes with dielectric or electrically insulating material so that the electrodes are shielded from the plasma, and additionally by providing a path for the radiation to exit wherein the electrodes are not exposed to the area where the radiation is collected. The device includes: (a) a body, which is made of an electrically insulating material, that defines a capillary bore that has a proximal end and a distal end and that defines at least one radiation exit; (b) a first electrode that defines a first channel that has a first inlet end that is connected to a source of gas and a first outlet end that is in communication with the capillary bore, wherein the first electrode is positioned at the distal end of the capillary bore; (c) a second electrode that defines a second channel that has a second inlet end that is in communication with the capillary bore and an outlet end, wherein the second electrode is positioned at the proximal end of the capillary bore; and (d) a source of electric potential that is connected across the first and second electrodes, wherein radiation generated within the capillary bore is emitted through the at least one radiation exit and wherein the first electrode and second electrode are shielded from the emitted radiation.

22 Claims, 2 Drawing Sheets

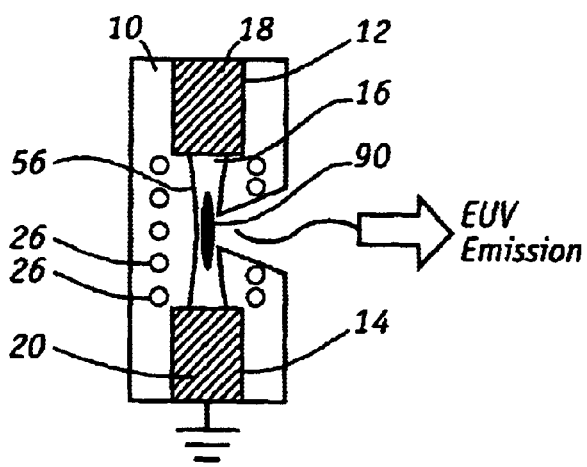
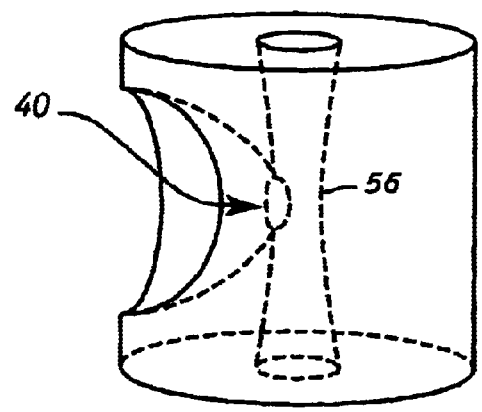
FIG. 4  FIG. 5
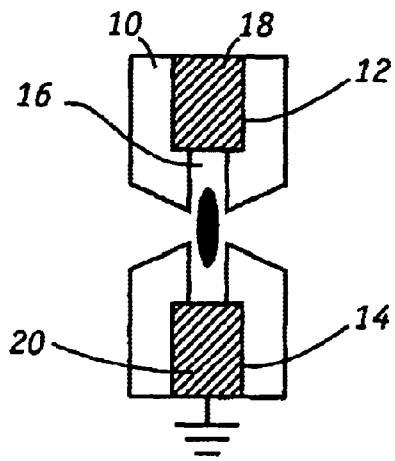
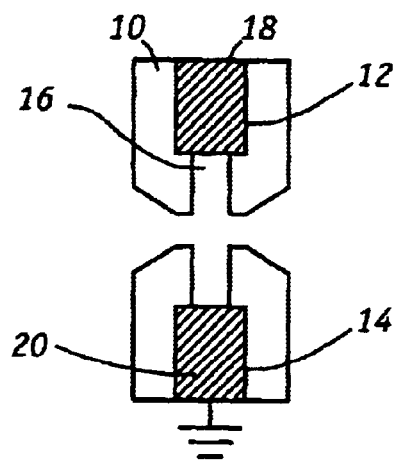
FIG. 6  FIG. 7
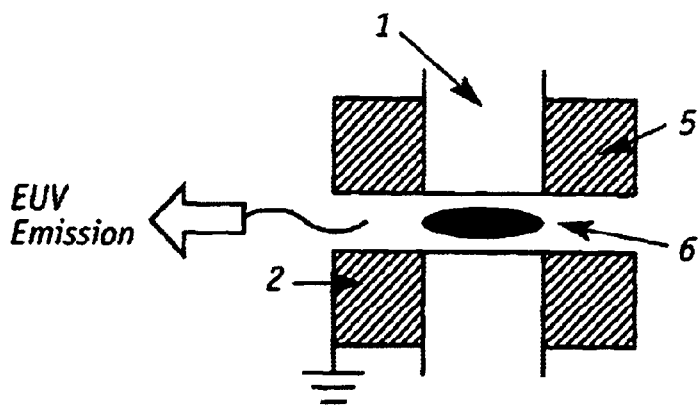
FIG. 8
(prior art)

CAPILLARY DISCHARGE SOURCE

This invention was made with Government support under Contract No. DE-AC04-94AL85000 awarded by the U.S. Department of Energy to Sandia Corporation. The Government has certain rights to the invention.

FIELD OF THE INVENTION

This invention relates generally to the production of extreme ultraviolet and soft x-rays with an electric discharge source for projection lithography. In particular, the invention is directed to a capillary discharge source where the electrodes are encased with dielectric or electrically insulating material so that the electrodes are shielded from the plasma. Additionally, the radiation escapes or is collected through the side of the device or transversely via one or more of a radiation exit, and away from any contact with the electrodes.

BACKGROUND OF THE INVENTION

The present state-of-the-art for Very Large Scale Integration ("VLSI") involves chips with circuitry built to design rules of 0.25 $\mu$m. Effort directed to further miniaturization takes the initial form of more fully utilizing the resolution capability of presently-used ultraviolet ("UV") delineating radiation. "Deep UV" (wavelength range of $\lambda$=0.3 $\mu$m to 0.1 $\mu$m), with techniques such as phase masking, off-axis illumination, and step-and-repeat may permit design rules (minimum feature or space dimension) of 0.18 $\mu$m or slightly smaller.

To achieve still smaller design rules, a different form of delineating radiation is required to avoid wavelength-related resolution limits. One research path is to utilize electron or other charged-particle radiation. Use of electromagnetic radiation for this purpose will require x-ray wavelengths. Various x-ray radiation sources are under consideration. One source, the electron storage ring synchrotron, has been used for many years and is at an advanced stage of development. Synchrotrons are particularly promising sources of x-rays for lithography because they provide very stable and defined sources of x-rays, however, synchrotrons are massive and expensive to construct. They are cost effective only when serving several steppers.

Another source is the laser plasma source (LPS), which depends upon a high power, pulsed laser (e.g., a yttrium aluminum garnet ("YAG") laser), or an excimer laser, delivering 500 to 1,000 watts of power to a 50 $\mu$m to 250 $\mu$m spot, thereby heating a source material to, for example, 250,000° C., to emit x-ray radiation from the resulting plasma. LPS is compact, and may be dedicated to a single production line (so that malfunction does not close down the entire plant). The plasma is produced by a high-power, pulsed laser that is focused on a metal surface or in a gas jet. (See, Kubiak et al., U.S. Pat. No. 5,577,092 for a LPS design.)

Discharge plasma sources have been proposed for photolithography. Capillary discharge sources have the potential advantages in that they can be simpler in design than both synchrotrons and LPS's, and that they are far more cost effective. Klosner et al., "Intense plasma discharge source at 13.5 nm for extreme-ultraviolet lithography," Opt. Lett. 22, 34 (1997), reported an intense lithium discharge plasma source created within a lithium hydride (LiH) capillary in which doubly ionized lithium is the radiating species. The source generated narrow-band EUV emission at 13.5 nm from the 2-1 transition in the hydrogen-like lithium ions. However, the source suffered from a short lifetime (approximately 25–50 shots) owing to breakage of the LiH capillary.

Another source is the pulsed capillary discharge source described in Silfvast, U.S. Pat. No. 5,499,282, which promised to be significantly less expensive and far more efficient than the laser plasma source. However, the discharge source also ejects debris that is eroded from the capillary bore and electrodes. An improved version of the capillary discharge source covering operating conditions for the pulsed capillary discharge lamp that purportedly mitigated against capillary bore erosion is described in Silfvast, U.S. Pat. No. 6,031,241.

Debris generation remains one of the most significant impediments to the successful development of the capillary plasma discharge sources in photolithography. The particles are ejected from the surfaces of the capillary and electrode due to ablation caused by the absorption of intense pulses of electrical energy. These particles are generally small (less than one micron) and have very large velocities (greater than 100 m/s).

FIG. 8 is a cross sectional view of an electric capillary discharge source which has a longitudinal arrangement whereby the capillary 1 and electrodes 2 and 5 consist of cylindrical disks with an on-axis opening. A high voltage pulse is applied to the electrodes 2 and 5 which generates a plasma 6 leading to short wavelength emission from the plasma. The radiation is emitted along this axis and collected and directed for some purpose such as extreme-ultraviolet lithography. This design suffers from some drawbacks; the main concern with this geometry is that debris is generated by the interaction of the plasma with the walls of the capillary and the electrodes. This debris is also ejected along the axis or bore in the same direction that useful light is collected. Mirrors and other light collecting optics are directly in-line with the debris and thus quickly become coated with the ablated material. This has the effect of reducing the effectiveness and lifetime of the light collecting optics.

Debris is generated when the high voltage and high current pulse heats the plasma and causes electrons and ions to stream through the bore and impact the electrodes. Sputtering of the electrode material is an inherent limitation of this type of longitudinal design. Thus, the electrodes themselves are a significant source of the debris composition.

SUMMARY OF THE INVENTION

The present invention is based in part on the recognition that debris generation from an EUV electric discharge plasma source can be significantly reduced or essentially eliminated by encasing the electrodes with dielectric or electrically insulating material so that the electrodes are shielded from the plasma. Additionally, the radiation escapes or is collected through the side of the device or transversely via one or more of a radiation exit, and away from any contact with the electrodes.

In one aspect, the invention is directed to an extreme ultraviolet and soft x-ray radiation electric discharge plasma source that includes:

(a) a body, which is made of an electrically insulating material, that defines a capillary bore that has a proximal end and a distal end and that defines at least one radiation exit;

(b) a first electrode that defines a first channel that has a first inlet end that is connected to a source of gas and a first outlet end that is in communication with the capillary bore, wherein the first electrode is positioned at the distal end of the capillary bore;

(c) a second electrode that defines a second channel that has a second inlet end that is in communication with the capillary bore and a second outlet end, wherein the second electrode is positioned at the proximal end of the capillary bore; and (d) a source of electric potential that is connected across the first and second electrodes, wherein radiation generated within the capillary bore is emitted through the at least one radiation exit and wherein the first electrode and second electrode are shielded from the emitted radiation.

In a preferred embodiment, the discharge plasma source has one radiation exit which is located at or near the middle of the capillary bore as measured along its length. In another embodiment, the capillary bore has two radiation exits that are located on the side of the body and that are substantially opposite each other. In a third embodiment, the discharge plasma source defines an open gap that separates the body into two units so that radiation radiates in a full 360 degrees azimuthal direction or some fraction thereof.

BRIEF DESCRIPTION OF THE DRAWINGS

FIGS. 1–7 depict various embodiments of the inventive electric discharge source; and FIG. 8 is a prior art electric discharge source.

DETAILED DESCRIPTION OF THE INVENTION

Figure 1:
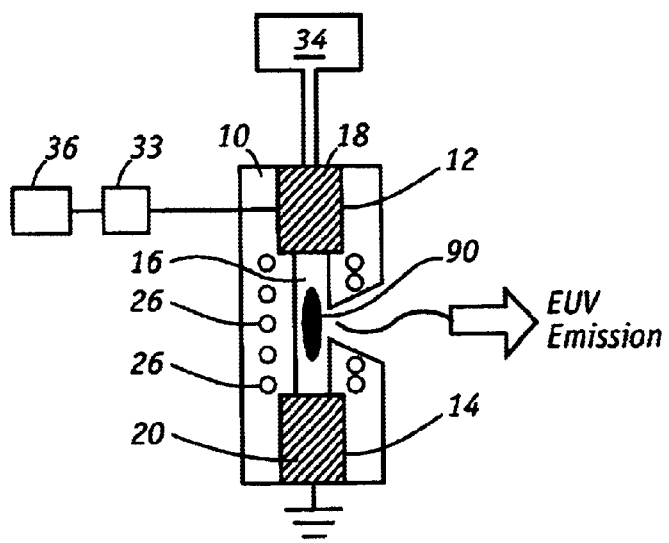
Figure 2:
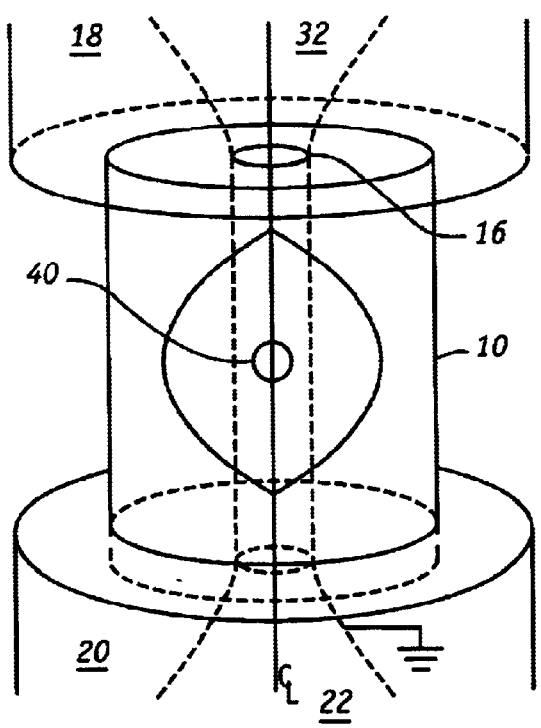
Figure 3:
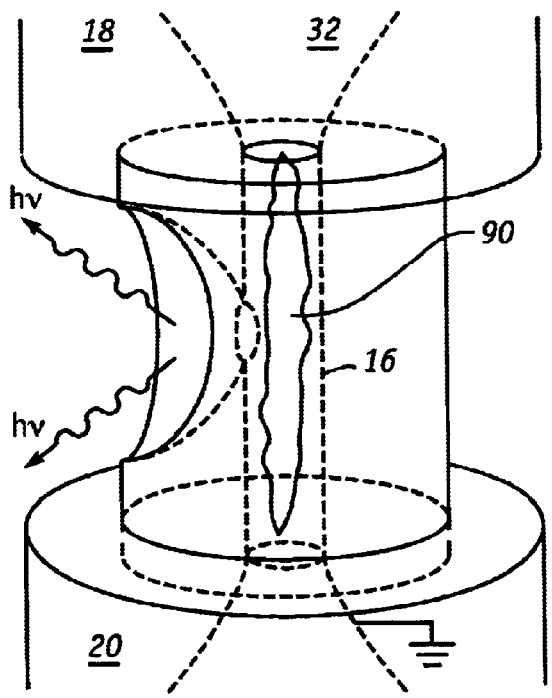

FIGS. 1, 2 and 3 are cross sectional, front cut-out and side cut-out views, respectively, of one embodiment of the electric capillary discharge source which includes an insulating capillary 10 configured to define two cavities 12, 14 within each end of the insulating capillary. The capillary 10 also has a capillary bore 16 which is preferably centered on-axis. High voltage electrode 18 and grounded electrode 20 are positioned within cavities 12, 14, respectively. Electrode 20 has a channel 22 with an inlet and outlet; channel 22 having a center that is aligned with the center of the capillary bore 16, which typically has a diameter of about 3–4 mm. Electrode 18 has a channel 32 with an inlet and an outlet: the center of channel 32 also aligned with the center of the capillary bore 16. The outlet is connected to the capillary bore 16 while the inlet is connected to a gas source 34. Electrode 18 is also connected to a source of electric potential 36 which includes a switch mechanism 38 to generate electric pulses. The insulating capillary also defines at least one radiation exit 40 on its side, which is typically a port with a diameter of about 1 mm or less. The exit can have other configurations, e.g., slit. In one preferred embodiment as illustrated, the exit has a bevel configuration that allows the radiation emanating from the capillary bore to expand outward.

The electrodes are made of any suitable electrically conductive and erosion resistant material such as refractory metals, e.g., stainless steel. A particularly preferred material is tantalum or tungsten. The insulating capillary is made of a ceramic material, preferably, boron nitride, and more preferably of pyrolytic boron nitride, compression annealed pyrolytic boron nitride, or cubic boron nitride. These materials are commercially available from Advanced Ceramics of Cleveland, Ohio. It has been demonstrated that boron nitride, which is relatively highly thermally conductive (for a ceramic), is particularly suited for use in the electric discharge source because of its exceptional resistance to erosion.

The electric capillary discharge source employs a pulsed electric discharge in a low-pressure gas to excite a plasma confined within a capillary bore region. A high-voltage, high-current pulse is employed to initiate the discharge thereby creating a plasma, e.g., of temperature 2–50 eV, that radiates in the EUV region. The source of gas, 34, contains any suitable gas or mixtures of gases that can be ionized to generate a plasma from which radiation of the desired wavelength occurs. For generating extreme ultraviolet radiation and soft x-rays, xenon is preferred. Other suitable gases include mixtures of xenon and helium. It is understood that the term "gas" also includes metal vapors and mixtures of metal vapors and gas. Thus the source of gas can also supply suitable ionizable metal vapors as well. When the source is operated at a high repetition rate, it may be desirable to use cooling tubes or other means to efficiently remove excess heat. Cooling tubes 26, for example, could run through the insulating capillary 10. This is possible since the overall diameter of the source can be made large enough to accommodate such an arrangement. Cooling tubes 26, for example, could run through the insulating capillary 10. This is possible since the overall diameter of the source can be made large enough to accommodate such an arrangement.

In an embodiment of the capillary electric discharge source the electrodes are encased in the insulating capillary itself. The electrodes are therefore not exposed in the area where the radiation is collected, since the radiation exit 40 is on the side of the insulating capillary and radiation is collected in this transverse direction not in contact with an electrode.

FIGS. 4 and 5 are cross section and side cut-out views, respectively, of an embodiment that employs a tapered capillary bore 56; the other components of the electric capillary discharge source are the same as illustrated in FIGS. 1–3. This tapered configuration permits one to tailor the plasma conditions, such as electron temperature and electron density within the capillary bore. For example, this geometry will allow higher gas pressures which could lead to optimization of the EUV radiation output.

The number of radiation exits on the side of the capillary bore can be varied to allow radiation to be directed in multiple directions. FIG. 6 is a cross section view of a source that has two exits 62, 64 that are positioned on opposite sides of the capillary bore 60. All the other components are the same as shown in FIGS. 1–3.

FIG. 7 is an embodiment that permits radiation to be collected from the source in essentially a full 360° azimuthal direction or fraction thereof. The electric capillary discharge source which includes insulating capillary members 70,72 each configured to define a cavity 74, 76, respectively, in which electrodes 78, 80 are positioned. The capillary members 70,72 also has capillary bores 82,84 respectively. When the two distal portions are positioned opposite each other as shown in FIG. 7, a space or gap 90 is created between the two capillary members. Plasma is created within this gap during operation and the radiation that is generated emanates from the gap in 360° direction. The outer surfaces on the distal portions of the two capillary members are preferably shaped such that a bevel configuration is formed to allow the radiation to expand outward from the capillary bore.

It is expected that the electric discharge capillary source of the present invention can be operated at significantly higher gas pressures which would translate into higher efficiency and higher EUV emission. Pressure range would be from 1 torr to 100 torr. In addition, high current densities could also be generated with the new design allowing an increase in the amount of useable EUV due to the proportional scaling of the current density to radiation output.

Furthermore, with the present invention, pre-ionization of the capillary bore can be readily accomplished due to the ability to maintain optimum pressure conditions throughout the length of the capillary bore. Pre-ionization being defined as applying a low current (~10 A) pulse to the discharge prior to, or simultaneously with, the main high current EUV excitation current pulse. Also, discharge stability will improve due to the more uniform pressure. This is in contrast to the longitudinal type which is differentially pumped and thus has a pressure gradient from front to back.

In operation, the opening of the front electrode is connected to a housing that defines a vacuum chamber. Causing an electric discharge in the capillary bore sufficient to create a plasma 90 within the capillary bore produces extreme ultraviolet and soft x-ray radiation into the vacuum chamber is which is typically maintained at a pressure of less than about $1 \times 10^{-3}$ Torr. Typically, the electric discharge creates a 20 to 50 eV temperature plasma. The electric discharge can be excited by current pulses with durations between about 0.1 to 4 $\mu$sec and at repetition rates to many thousands per second (i.e., multi-kilohertz).

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. An extreme ultraviolet and soft x-ray radiation electric discharge plasma source that comprises:
   (a) a body, which is made of an electrically insulating material, that defines a capillary bore that has a proximal end and a distal end;
   (b) one or more radiation exits disposed between the distal end and the proximal end of the capillary, wherein radiation generated within the capillary is emitted from said one or more radiation exits in a direction that is transverse to the axis of said capillary;
   (c) a first electrode that defines a first channel that has a first inlet end that is connected to a source of gas and a first outlet end that is in communication with the capillary bore, wherein the first electrode is positioned at the distal end of the capillary bore;
   (d) a second electrode that defines a second channel that has a second inlet end that is in communication with the capillary bore and a second outlet end, wherein the second electrode is positioned at the proximal end of the capillary bore; and
   (e) a source of electric potential that is connected across the first and second electrodes.

2. The discharge plasma source of claim 1 wherein the body is configured to shield the first electrode and second electrode from the emitted radiation.

3. The discharge plasma source of claim 1 wherein the body comprises a unitary structure defining a first cavity in which the first electrode is positioned and a second cavity in which the second electrode is positioned.

4. The discharge plasma source of claim 1 wherein the capillary bore has a circular cross section.

5. The discharge plasma source of claim 1 wherein the capillary bore has a tapered interior surface so that the cross sectional area of the capillary bore is smallest at or near the middle of the capillary bore as measured along its length.

6. The discharge plasma source of claim 5 wherein the at least one radiation exit is located at or near the middle of the capillary bore.

7. The discharge plasma source of claim 1 comprising one radiation exit which is located at or near the middle of the capillary bore as measured along its length.

8. The discharge plasma source of claim 1 wherein the capillary bore has two radiation exits that are located on the side of the body and that are substantially opposite each other.

9. The discharge plasma source of claim 1 wherein the at least one radiation exit defines an open gap that separates the body into two units so that radiation radiates in a full 360 degrees azimuthal direction or some fraction thereof.

10. The discharge plasma source of claim 1 wherein the at least one radiation exit has a bevel configuration.

11. The discharge plasma source of claim 1 wherein the at least one radiation exit radially expands in an outward direction.

12. The discharge plasma source of claim 1 wherein the body is made of a dielectric or electrically insulating material.

13. The discharge plasma source of claim 12 wherein the dielectric material comprises boron nitride that is selected from the group consisting of pyrolytic boron nitride, compression annealed pyrolytic boron nitride, and cubic boron nitride.

14. The discharge plasma source of claim 1 wherein the source of gas supplies a gas that is selected from the group consisting of xenon, neon and mixtures thereof.

15. The discharge plasma source of claim 1 wherein the source of gas supplies metal vapors or a mixture of metal vapors and one or more gases.

16. The discharge plasma source of claim 1 wherein the second electrode is grounded.

17. A method of producing extreme ultra-violet and soft x-ray radiation that comprises the steps of:
   (a) providing an electric discharge plasma source that comprises:
      (i) a body, which is made of an electrically insulating material, that defines a capillary bore that has a proximal end and a distal end;
      (ii) one or more radiation exits disposed between the distal end and the proximal end of the capillary, wherein radiation generated within the capillary is emitted from said one or more radiation exits in a direction that is transverse to the axis of said capillary;
      (iii) a first electrode that defines a first channel that has a first inlet end that is connected to a source of gas and a first outlet end that is in communication with the capillary bore, wherein the first electrode is positioned at the distal end of the capillary bore;
      (iv) a second electrode that defines a second channel that has a second inlet end that is in communication with the capillary bore and a second outlet end, wherein the second electrode is positioned at the proximal end of the capillary bore; and
      (v) a source of electric potential that is connected across the first and second electrodes;

(vi) a housing that defines a vacuum chamber that is in communication with said one or more radiation exits;

(b) introducing a gas, metal vapors, or both a gas and metal vapors from the source of gas into the channel of the first electrode and into the capillary bore; and (c) causing an electric discharge in the capillary bore sufficient to create a plasma within the capillary bore thereby producing radiation of a selected wavelength.

18. The method of claim 17 wherein the gas is selected from the group consisting of xenon, neon and mixtures thereof.

19. The method of claim 17 wherein step (b) comprises introducing metal vapors or a mixture of metal vapors and gas into the channel.

20. The method of claim 17 wherein the pressure within the vacuum chamber during step (c) is less than about $1 \times 10^{-3}$ Torr.

21. The method of claim 17 wherein step (d) creates a 20 to 50 eV plasma.

22. The method of claim 17 wherein step (d) comprises causing a pulse electric discharge for between about 0.1 to 4 μsec.

* * * * *